United States Patent [19]

Braathen

[11] Patent Number: 5,172,071
[45] Date of Patent: Dec. 15, 1992

[54] LINEARIZED OUTPUT CONTROL OF A NONLINEAR AMPLIFIER

[75] Inventor: Russell E. Braathen, Calgary, Canada

[73] Assignee: NovAtel Communications Ltd., Calgary, Canada

[21] Appl. No.: 831,906

[22] Filed: Feb. 5, 1992

[51] Int. Cl.[5] ............................................. H23G 3/20
[52] U.S. Cl. .................................... 330/129; 330/134; 330/279; 375/98; 455/116; 455/126
[58] Field of Search ............... 330/127, 129, 134, 279; 375/98; 455/116, 126

[56] References Cited

U.S. PATENT DOCUMENTS

| 4,523,155 | 6/1985 | Walczak et al. | 330/279 |
| 4,546,326 | 10/1985 | Van Uffelen et al. | 330/129 |
| 4,602,218 | 7/1986 | Vilmur et al. | 330/279 |
| 4,952,886 | 8/1990 | Braathen et al. | 330/279 |
| 5,003,270 | 3/1991 | Braathen | 330/279 |
| 5,043,672 | 8/1991 | Youn | 330/129 |

FOREIGN PATENT DOCUMENTS

| 0175058 | 3/1986 | European Pat. Off. |
| 0314962 | 5/1989 | European Pat. Off. |
| 0322525 | 7/1989 | European Pat. Off. |
| 2060292 | 4/1981 | United Kingdom |

Primary Examiner—James B. Mullins
Attorney, Agent, or Firm—Cesari and McKenna

[57] ABSTRACT

An amplifier circuit for providing precise linear control over the output of a nonlinear amplifier, including a nonlinear gain controllable amplifier and an output control circuit. The output control circuit is connected to sample the signal output by the nonlinear amplifier. The amplifier output signal may be a continuous or a discontinuous signal. The output control circuit also receives a baseband signal. The sampled amplifier output signal and the baseband signal are alternatively transmitted to a detector. The detector produces a signal representative of the power level of either the sampled amplifier output signal or the baseband signal. The signals produced by the detector are stored separately in a pair of sample-and-hold circuits. A difference amplifier determines the difference between the stored signals and transmits this difference signal to the gain control input of the amplifier. The output signal from the amplifier is thereby adjusted to linearly track the baseband signal.

16 Claims, 2 Drawing Sheets

LINEARIZED OUTPUT CONTROL OF A NONLINEAR AMPLIFIER

FIELD OF THE INVENTION

This invention relates generally to radio frequency (RF) amplifiers, and particularly to a circuit for linearly controlling the output response of a nonlinear amplifier.

BACKGROUND OF THE INVENTION

Contemporary analog cellular telephone systems use frequency modulation to impress baseband voice and data information onto a carrier signal. The modulated carrier signal is then fed to a radio frequency (RF) amplifier that includes a servo loop which precisely controls the radiated RF power level, to conform to cellular operating standards.

In the typical servo loop, the output of the RF amplifier is sampled and supplied to a power level detector. The detected power level is then compared against a reference voltage which has been selected from one of several possible voltages, each of which corresponds to one of the several output power level settings specified by the pertinent cellular operating standard. For example, in North America, there are eight possible power levels for mobile transceivers and six possible output power level settings for portable transceivers. A difference amplifier then compares the detected power level and the reference voltage to provide a difference signal. The difference signal is supplied to control the gain of the RF amplifier.

Nonlinear RF amplifiers, such as Class-C amplifiers, are particularly suited for use in current analog cellular telephone systems. They can be used directly in a system using frequency modulation. Additionally, nonlinear RF amplifiers are less expensive and consume less power than their linear counterparts. Thus, the production costs are lower and the operation times for battery operated units are longer when nonlinear amplifiers are used.

One problem with present-day analog systems, however, is the limited bandwidth available at the frequencies allocated to cellular transceivers. In an effort to reduce the expected crowding, new digital modulation operating standards have been developed. These standards specify that the baseband voice is to be digitized, combined with control information, and then impressed onto an RF carrier using a so-called Ó/4DQPSK modulation. This modulation requires simultaneous amplitude modulation (AM) and quadrature phase-shift keying modulation (QPSK). For further details of this modulation format, see the article by David M. Hoover, "An Instrument for Testing North American Digital Cellular Radios", in the April, 1991, Hewlett-Packard Journal.

While this modulation scheme will serve a greater number of users within a given bandwidth, it poses novel design challenges. In particular, the new standards not only require precise transmission of a signal frequency and power level, but also precise transmission of its amplitude and phase as well. Conventional wisdom is that because nonlinear amplifiers introduce amplitude and phase distortion, they cannot be used directly in a digital cellular system. Precise control of the output power level of a non-linear amplifier is also more difficult because the amplifier must exhibit a linear response at each of the possible power levels, in order to preserve the signal amplitude.

While Class-A and Class-AB amplifiers may be used to obtain a linear response, as noted earlier, they are more expensive and consume more power. Additionally, linear amplifiers typically require complicated control circuits to maintain sufficient bandwidth over a wide range of operating conditions.

What is needed is a control circuit that allows a nonlinear RF amplifier, such as a Class-C amplifier, to be used for accurately transmitting the frequency, amplitude, and phase of a digitally modulated signal. This would be particularly true if the control circuit could also be adapted for precise output power level control, as is needed in cellular transmitters.

SUMMARY OF THE INVENTION

The invention is a circuit which controls the response of a nonlinear amplifier in such a way that the nonlinear amplifier outputs an RF signal which linearly tracks an input baseband signal at an assigned output power level. The control circuit samples and compares the RF output signal against the input baseband signal and generates a difference signal which is supplied to a gain control input of the nonlinear amplifier, thereby permitting the nonlinear amplifier to simulate a linear response.

More particularly, the control circuit includes an RF sampling means, a signal modulation and selection means, detection means, a pair of sample-and-holds and a difference amplifier. The sampling means, which may be a directional coupler which samples the RF output and generates a sampled output signal. The sampled output signal and the input baseband signal are modulated and then alternately selected by the signal modulation and selection means, which in turn drives the detection means. The sample-and-hold circuits are connected to the output of the power level detector, and alternately activated. One sample-and-hold samples the detection means output when the modulated sampled output signal is being received, otherwise remaining in a hold mode. The other sample-and-hold samples the detector when the modulated input baseband signal is received, otherwise remaining in a hold mode. The difference amplifier determines the difference between the signals held by the sample-and-hold circuits and produces a difference signal. The difference signal is fed back to the gain control input of the nonlinear amplifier, thereby adjusting its output power level.

The invention may also be adapted for discontinuous RF output signals. In this embodiment, the sampled output signal periodically drops to a zero output power level. As such, the modulation and selection means is unnecessary, since the sampled output signal is already discontinuous.

The invention has several advantages, the primary one being that a nonlinear amplifier is essentially converted into a linear amplifier equivalent. As a result, a less expensive Class-C amplifier may be used in an application, such as a digital cellular transceiver, where before it has been necessary to use a more expensive linear amplifier. In addition, the amplitude and phase information in the baseband signal is linearly tracked and faithfully reproduced at the amplifier output, while providing precise linear control over the output power level. Nonlinearities and/or offset voltages introduced by the power level detector are also corrected.

BRIEF DESCRIPTION OF THE DRAWINGS

The novel features believed to be characteristic of the invention are pointed out in the appended claims. The best mode for carrying out the invention and its particular features and advantages can be better understood by referring to the following detailed description, read together with the accompanying drawings, in which:

DETAILED DESCRIPTION OF ILLUSTRATIVE EMBODIMENTS

A new digital cellular modulation standard, known as Ó/4DQPSK modulation, requires simultaneous amplitude modulation (AM) and quadrature phase-shift keying modulation (QPSK) of a transmitted signal. Preservation of this amplitude and phase information is crucial in a cellular transceiver. Thus, unlike prior analog cellular systems, where only the frequency of the modulated signal needs to be preserved and therefore a nonlinear amplifier can be used directly, a nonlinear amplifier cannot be used directly in such a digital cellular system because the amplitude and phase information would be lost or grossly distorted.

Figure 1:
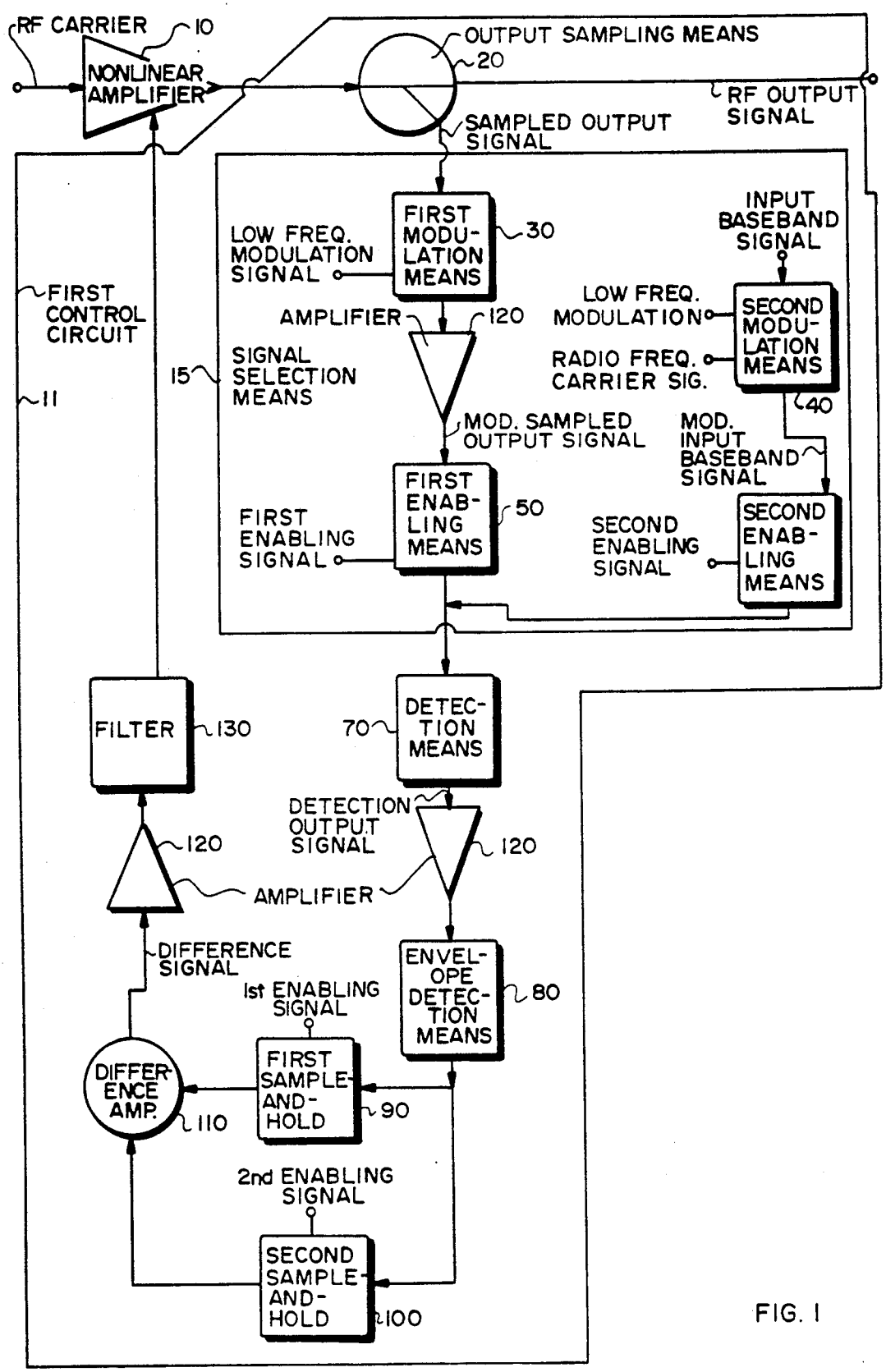
FIG. 1 is a block diagram of an output control circuit for a nonlinear power amplifier with a continuous output signal according to the invention.

The circuit of FIG. 1 enables a nonlinear radio frequency (RF) amplifier 10 to be used in a digital cellular transceiver. Basically, a control circuit 11 is connected between the output and the gain control input of the nonlinear amplifier 10, forming a feedback loop. The control circuit 11 includes an output sampling means 20, a first signal selection means 15, a detection means 70, a first sample-and-hold circuit 90, a second sample-and-hold circuit 100, and a difference amplifier 110.

The output of the nonlinear amplifier 10 is sampled by the output sampling means 20 which produces a sampled output signal. The sampled output signal is fed to a signal selection means 15, which also receives an input baseband signal. The input baseband signal may be generated, for example, from voice and data information by simultaneous amplitude modulation (AM) and quadrature phase-shift keying modulation (QPSK).

The signal selection means 15 modulates the sampled output signal and the input baseband signal to generate a modulated sampled output signal and a modulated input baseband signal, respectively, which are alternately transmitted to the detection means 70. The detection means 70 produces a detector output signal representative of the power level of either the modulated sampled output signal or the modulated input baseband signal. The detector output signal is stored alternately by either the first 90 or second 100 sample-and-hold circuit. The difference amplifier 110 then determines the difference between the stored detector output signals and transmits this difference as a signal which controls the gain of the amplifier 10.

By so adjusting the difference signal fed to the gain contro input, the RF output signal of the nonlinear amplifier 10 is also adjusted to linearly track changes in the input baseband signal. Specifically, the control circuit 11 adjusts the gain of the nonlinear amplifier 10 in such a way that any changes in the input baseband signal result in a proportional change in the RF output signal. The only restriction is that this adjustment in the output of the nonlinear amplifier 10 must occur at a rate which is faster than the rate at which changes in the input baseband signal are received, so that the control circuit 11 has enough time to adjust the output of the nonlinear amplifier 10. In other words, the bandwidth of the control circuit 11 must be greater than the bandwidth of the input baseband signal.

More particularly, the nonlinear amplifier 10 in FIG. 1 has a radio frequency (RF) input, a gain control input, and an RF output. The RF input receives an RF carrier signal, and the gain control input receives a difference signal from the difference amplifier 110.

The output sampling means 20 samples the RF output signal from the nonlinear amplifier 10, to generate a sampled output signal consisting of a voltage which is proportional to the power level in the RF output signal. Typically, a directional coupler is used as the output sampling means 20.

Figure 2:
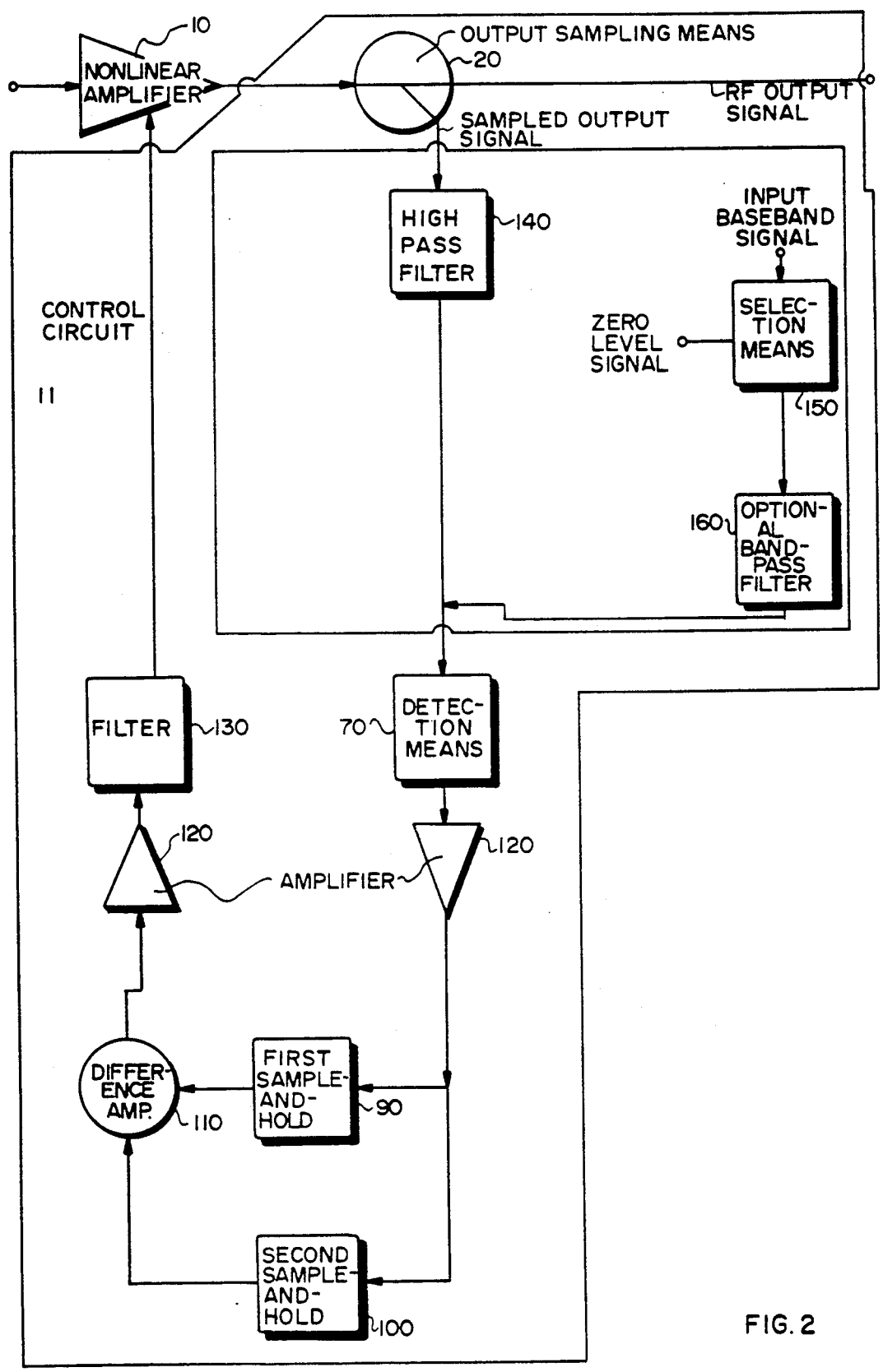
FIG. 2 is a block diagram of the output control circuit with a discontinuous output signal according to the invention.

The sampled output signal is then supplied to the signal selection means 15. The preferred implementation of the signal selection means 15 differs, depending upon the type of RF output signal which is normally expected. With a continuous RF output signal expected, as shown in FIG. 1, the signal selection means 15 includes a first modulation means 30, a second modulation means 40, a first enabling means 50, and a second enabling means 60. With a discontinuous RF output signal expected, as shown in FIG. 2, the signal selection means 15 includes a high pass filter 140 and a selection means 150. The signal selection means 15 of FIG. 2 is explained in greater detail below.

Returning to the embodiment of FIG. 1, the first modulation means 30 receives the sampled output signal and a low frequency modulation signal and outputs a modulated sampled output signal, which serves as a lower frequency version of the sampled output signal. A lower frequency signal is more desirable because it generates less noise in the system. Additionally, the higher the frequency of the sampled output signal becomes, the more expensive the detector diode in the detection means 70. Typically, the low frequency modulation signal is a square wave. It should have a frequency at least twice as high as the frequency of the first and second enabling signals used by the enabling means 50 and 60. This guarantees that the modulated sampled output signal is properly sampled according to the well-known request criteria.

An amplifier 120 may be connected to the output of the first modulation means 30, to increase the signal level of the modulated sampled output signal.

The modulated sampled output signal is in turn received by the first enabling means 50. The first enabling means 50 also has an input for the first enabling signal. When the first enabling signal is received, the first enabling means 50 is enabled and the modulated sampled output signal is transmitted to the detection means 70.

The signal selection means 15 also includes a second modulation means 40 and a second enabling means 60. The second modulation means 40 receives the input baseband signal, the low frequency modulation signal, and possibly a radio frequency carrier signal.

The input baseband signal is typically generated by a circuit (not shown) which impresses digital baseband voice and data information on to a carrier signal using the desired digital modulation and then combines it with an output power level control signal. The low frequency modulation signal fed to the second modulation means is the same low frequency modulation signal fed to the first modulation means 30. Again, the low frequency modulation signal has a frequency at least twice as high as the frequency of the second enabling signal and is typically a square wave.

A radio frequency carrier signal may also be input into the second modulation means 40 for additional modulation if the detection means 70 is sensitive to radio frequency signals. In particular, the detection means 70 may be unable to detect the output power level of the modulated input baseband signal. Thus, to enable the detection means 70 to operate accurately, a radio frequency carrier signal may be fed to the second modulation means 40 for additional modulation. The particular radio frequency carrier signal used for the modulation will be whatever is necessary to make the detection means 70 operate properly.

The modulated input baseband signal is received by the second enabling means 60, which also receives the second enabling signal. When the second enabling signal is asserted true, the second enabling means allows the modulated input baseband signal to be transmitted to the detection means 70.

The first enabling signal is exactly the complement, or 180 degrees out of phase with, the second enabling signal, to insure that the two enabling means 50 and 60 are never enabled at the same time.

The detection means 70 receives the output of both the enabling means 50 and 60. Typically, the detection means 70 is a half wave rectifier such as a detector diode. Detector diodes have a forward direct current (DC) voltage drop that is affected by changes in temperature, and accordingly cause the output power level of the amplifier to fluctuate. However, since the modulated sampled output signal and the modulated input baseband signal are alternately supplied to the same detector diode, they are therefore affected by the same changes. When the difference between the two signals is determined by the difference means 110, and changes induced in each signal cancel each other out. Thus, any temperature-induced offset introduced by the detection means 70 is not a concern.

An amplifier 120 may be connected to the output of the detection means 70, if the level of the detector output signal is inadequate.

The envelope detection means 80, connected to the output of the detection means 70 (or the amplifier 120, if included), removes the low frequency modulation signal from the detector output signal. The envelope detection means 80 is not necessary if the low frequency modulation signal is a square wave, because the first and second sample-and-hold circuits are then able to detect the signal peak directly.

The first and second sample-and-hold circuits 90 and 100 are connected to the output of the envelope detection means 80. The first enabling signal received by the first enabling means 50 is also received by the first sample-and-hold circuit 90. When the first enabling signal enables the first enabling means 50, it also causes the first sample-and-hold circuit 90 to sample the output of the envelope detection means 80. Likewise, the second sample-and-hold circuit 100 receives the second enabling signal to enable the second enabling means 60 and cause the second sample-and-hold circuit 100 to sample the output of the envelope detection means 80. The first and second sample-and-hold circuits 90 and 100 never sample the envelope detection means 80 simultaneously. Preferably, the first and second sample-and-hold circuits 90 and 100 enter the sample made at the end of the cycle of the first and second enabling signals. The first and second sampled signals are stored as voltages in the first and second sample-and-hold circuits 90 and 100.

A difference amplifier 110 is connected to the outputs of the sample-and-hold circuits 90 and 100, to generate a difference signal from the held first and second sampled signals. An amplifier 120 and filter 130 may be connected to the output of the difference amplifier 110, if necessary, which adjust the level and bandwidth of the difference signal. The filter 130 should have the same bandwidth as the input baseband signal.

The difference signal is then fed to the gain control input of the nonlinear amplifier 10, thereby adjusting its output level.

FIG. 2 is a block diagram illustrating the control circuit 11 which controls nonlinear amplifier 10 for a discontinuous RF output signal. The reference numerals used in FIG. 2 correspond to those found in FIG. 1 for similar blocks.

In the embodiment shown in FIG. 2, the discontinuous RF output signal may be obtained in at least two ways. A discontinuous RF signal may be supplied to the RF input of the nonlinear amplifier 10; alternately, the nonlinear amplifier may be systematically turned on and off.

The output sampling means 20 connects the output of the nonlinear amplifier 10 to the signal selection means 15. In the embodiment, the signal selection means 15 includes a high pass filter 140 and a selection means 150. The output sampling means 20 samples the discontinuous RF output signal from the amplifier 10, and provides a sampled output signal to the high pass filter 140. The high pass filter 140 then forwards a filtered sampled output signal to the detection means 70.

As in the embodiment in FIG. 1, a second signal path in the signal selection means 15 includes the selection means 150. The selection means 150 receives the input baseband signal and a zero level signal that indicates when the RF output signal is at a zero power level. When the zero level signal is so asserted, the selection means 150 allows the input baseband signal to be fed to the detection means 70.

The detection means 70 is connected to the high pass filter 140 and the selection means 150, and provides a detector output signal indicative of the power level of the signals fed to its input. Thus, when the RF output signal, and hence the sampled output signal, is at a zero power level, the input baseband signal from the selection means 150 is transmitted to the detection means 70. An enabling means, or switch, to control when the sampled output signal is supplied to the detection means 70 is not necessary for this embodiment.

An amplifier 120 may be connected to the output of the detection means 70, if the level of the detector output signal is inadequate.

The first and second sample-and-hold circuits 90 and 100 are connected to the output of the detection means 70, as per the FIG. 1 embodiment. When the sampled output signal is not at a zero power level, then the first sample-and-hold circuit 90 samples the output of the detection means 70; otherwise, the first sample-and-hold circuit remains in a hold mode. When the sampled output signal from the nonlinear amplifier 10 is at a zero power level, then the second sample-and-hold circuit 100 samples the output of the detection means 90. The first and second sample-and-hold circuits 90 and 100 never sample the detection means 90 at the same time.

The difference amplifier 110, amplifier 120, and filter 130 operate to control the gain of the nonlinear amplifier 110 as in the embodiment of FIG. 1. The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A control circuit for providing precise linear control over the output of a nonlinear amplifier, the nonlinear amplifier connected to receive a radio frequency carrier signal and a gain control signal, and to generate a radio frequency output signal, the control circuit comprising:

signal modulation and selection means, connected to receive the RF output signal and a baseband signal, for alternately transmitting a modulated sampled output signal and a modulated baseband signal;

detection means, connected to receive the modulated sampled output signal and the modulated baseband signal, for generating a first power level signal indicative of the power level of the modulated sampled output signal, and for generating a second power level signal indicative of the power level of the modulated baseband signal;

a first sample-and-hold circuit connected to said detection means to sample and store the first power level signal;

a second sample-and-hold circuit connected to said detection means to sample and store the second power level signal; and means for comparing the first power signal to the second power signal, to generate the gain control signal.

2. A control circuit as in claim 1 wherein the signal modulation and selection means further comprises:

means for sampling the output signal, and for generating a sampled output signal;

means for modulating the sampled output signal and for generating a modulated-sampled-output signal;

first enabling means, for selectively enabling the transmission of the modulated-sampled-output signal;

means for modulating the baseband signal, and for generating a modulated-baseband signal; and second enabling means, for selectively enabling transmission of the modulated-baseband signal.

3. A control circuit as in claim 2 wherein said means for sampling the continuous output signal is a directional coupler.

4. A control circuit as in claim 2 wherein said means for modulating the sampled output signal is connected to receive, at an input, the sampled output signal and a modulation signal.

5. A control circuit as in claim 2 wherein said first enabling means is connected to receive the modulated sampled output signal and a first enabling signal.

6. A control circuit as in claim 2 wherein said means for modulating the baseband signal is connected to receive the baseband signal and a modulation signal.

7. A control circuit as in claim 6 wherein said means for modulating the baseband signal is additionally connected to receive a radio frequency signal.

8. A control circuit as in claim 2 wherein said second enabling means is connected to receive the modulated baseband signal and a second enabling signal.

9. A control circuit as in claim 1 wherein said detection means further comprises:

a half wave rectifier, connected to alternately receive the modulated sampled output signal and the modulated baseband signal, and to generate a rectified-modulated-sampled signal and a rectified-modulated-baseband signal;

envelope detection means, connected to receive the modulated sampled output signal and the modulated baseband signal, and to generate the first power level signal and the second power level signal.

10. A control circuit as in claim 1 wherein said means for comparing is a difference amplifier.

11. A circuit for linearly controlling the output of a non-linear amplifier, comprising:

signal selection means, connected to receive an amplifier output signal from the non-linear amplifier and a modulated baseband signal, and to selectively transmit one of the amplifier output signal or the modulated baseband signal;

detection means, connected to receive the amplifier output signal and the modulated baseband signal, and to generate a first power level signal indicative of the power level of the amplifier output signal, and to generate a second power level signal indicative of the power level of the modulated baseband signal;

first sample-and-hold circuit, connected to the detection means, to sample and store the first power level signal;

a second sample-and-hold circuit, connected to the detection means, to sample and store the second power level signal; and means for comparing the first power signal to the second power signal to generate a difference signal which controls the gain of the amplifier.

12. A circuit as in claim 11 wherein the signal selection means further comprises:

means for sampling the amplifier output signal and for generating a sampled output signal.

13. A circuit as in claim 12 wherein said means for sampling is a directional coupler.

14. A circuit as in claim 12 wherein said selection means is connected to receive the modulated baseband signal and a zero power level signal.

15. A circuit as in claim 11 wherein said detection means comprises a half wave rectifier connected to alternately receive the sampled output signal and the modulated baseband signal, and to generate the first power level signal and the second power level signal;

16. A circuit as in claim 11 wherein said means for comparing is a difference amplifier.

* * * * *